United States Patent
Hou

(10) Patent No.: US 10,156,793 B2
(45) Date of Patent: Dec. 18, 2018

(54) LIGHT-CURING TYPE 3D PRINTING DEVICE AND IMAGE EXPOSURE SYSTEM THEREOF

(71) Applicant: Prismlab China Ltd., Shanghai (CN)

(72) Inventor: Feng Hou, Shanghai (CN)

(73) Assignee: PRISMLAB CHINA LTD., Shanghai (CN)

( * ) Notice: Subject to any disclaimer, the term of this patent is extended or adjusted under 35 U.S.C. 154(b) by 101 days.

(21) Appl. No.: 15/115,076

(22) PCT Filed: Oct. 16, 2014

(86) PCT No.: PCT/CN2014/088725
§ 371 (c)(1),
(2) Date: Jul. 28, 2016

(87) PCT Pub. No.: WO2015/113408
PCT Pub. Date: Aug. 6, 2015

(65) Prior Publication Data
US 2016/0363869 A1    Dec. 15, 2016

(30) Foreign Application Priority Data
Jan. 28, 2014 (CN) .......................... 2014 1 0042058

(51) Int. Cl.
*G03F 7/20* (2006.01)
*B29C 64/129* (2017.01)
(Continued)

(52) U.S. Cl.
CPC ............ *G03F 7/702* (2013.01); *B29C 64/129* (2017.08); *B29C 64/20* (2017.08); *B33Y 30/00* (2014.12);
(Continued)

(58) Field of Classification Search
None
See application file for complete search history.

(56) References Cited

U.S. PATENT DOCUMENTS 6,204,875 B1 * 3/2001 De Loor .................. B41J 2/451
347/239
7,400,382 B2 * 7/2008 Baba-Ali ........... G02B 26/0833
(Continued)

FOREIGN PATENT DOCUMENTS

CN         1603961         4/2005
CN        101120285        2/2008
(Continued)

OTHER PUBLICATIONS

PCT/CN2014/088725, "International Search Report," dated Feb. 4, 2015, 4 pages.
CN201410698306.9, "Search Report", dated Jun. 2, 2017, 1 page.

*Primary Examiner* — Jacob T Minskey
*Assistant Examiner* — Baileigh Kate Darnell
(74) *Attorney, Agent, or Firm* — Kilpatrick Townsend & Stockton LLP

(57) ABSTRACT

An image exposure system of a 3D printing device having a spatial light modulator, a light source, a projection lens, a micro-displacement driving mechanism and a controller. The spatial light modulator is provided with a plurality of micromirrors for adjusting the reflective direction of light illuminating the micromirrors according to a control signal; the light source generates a light beam illuminating the spatial light modulator; the projection lens is aligned with a first direction of the spatial light modulator so that a micro light spot array formed through the micromirror by the light source projected onto the surface of a light-sensitive material; the micro-displacement driving mechanism is connected with the spatial light modulator, and can drive the spatial light modulator to move in third and fourth directions
(Continued)

that are perpendicular to each other, in order to finely adjust the position on the surface of the light-sensitive material onto which the micro light spot array is projected.

11 Claims, 11 Drawing Sheets

(51) Int. Cl.
    *G03F 7/00*      (2006.01)
    *B33Y 30/00*      (2015.01)
    *B29C 64/20*      (2017.01)

(52) U.S. Cl.
    CPC ............ *G03F 7/0037* (2013.01); *G03F 7/201* (2013.01); *G03F 7/70416* (2013.01)

(56) References Cited

U.S. PATENT DOCUMENTS

| | | | |
|---|---|---|---|
| 7,414,701 B2 * | 8/2008 | Kochersperger | G03F 7/70283 355/55 |
| 8,339,577 B2 * | 12/2012 | Xalter | G02B 26/0833 355/68 |
| 9,213,245 B2 * | 12/2015 | Fiolka | G02B 26/06 |
| 2005/0068510 A1 * | 3/2005 | Bleeker | G03F 7/70283 355/67 |
| 2005/0179772 A1 * | 8/2005 | Ishikawa | B23K 26/0604 347/255 |
| 2005/0191016 A1 * | 9/2005 | Ishikawa | B23K 26/0604 385/115 |
| 2008/0113293 A1 * | 5/2008 | Shkolnik | B33Y 10/00 430/270.1 |
| 2010/0271602 A1 | 10/2010 | Hanazaki | |
| 2015/0034007 A1 * | 2/2015 | Fischer | B05C 9/12 118/620 |

FOREIGN PATENT DOCUMENTS

| | | |
|---|---|---|
| CN | 101120285 A * | 2/2008 |
| CN | 101743515 | 6/2010 |
| CN | 102356353 | 2/2012 |
| JP | 2002353105 | 12/2002 |
| WO | 2011098790 | 8/2011 |

\* cited by examiner

LIGHT-CURING TYPE 3D PRINTING DEVICE AND IMAGE EXPOSURE SYSTEM THEREOF

CROSS-REFERENCE TO RELATED APPLICATIONS

The present application is the U.S. national stage of PCT/CN2014/088723, filed Oct. 16, 2014, which claims the benefit of priority to Chinese Patent Application No. 201410042058.02, filed Jan. 28, 2014, the entire contents of which are hereby incorporated by reference in their entirety.

TECHNICAL FIELD

The present invention relates to a photo-curing 3D printing apparatus, and especially to an image exposure system of a photo-curing 3D priming apparatus.

BACKGROUND 3D priming technology is a technology based on a computer three-dimensional design model and used to build up and band special materials, such as metal powder, ceramic powder, plastic and cell tissue in a layer-wise manner by means of a laser beam, a hot-melt nozzle etc. via software layered discretization and a numerical control molding system so as to finally mold same by super imposition to manufacture a physical product. Rather than shaping and cutting raw materials for finally obtaining a product in the traditional manufacturing industry by means of machining, such as molding and turn milling, 3D printing converts a three-dimensional physical object into several two-dimensional planes for production by processing and superimposing the materials layer by layer, thereby greatly reducing the complexity of manufacturing. This digital manufacturing mode can directly produce parts of any shape from computer graphic data without needing a complicated process, a large machine tool and massive labor, so that the production can be utilized by a broader range of producers.

At present, molding methods of 3D printing technology are still evolving, and the materials used are also various. Among these molding methods, photo-curing method is relatively mature. Photo-curing method uses the principle that a photosensitive resin is cured after being irradiated by an ultraviolet laser so as to mold the material in an additive way, and has the characteristics of, such as a high molding precision, a good surface finish and a high material utilization.

FIG. 1 shows a basic structure of s photo-curing 3D printing apparatus. Such a 3D printing apparatus 100 comprises a material tank 110 for accommodating a photosensitive resin, an image exposure system 120 for curing the photosensitive resin, and a lifting platform 130 for connecting a molding tool. The image exposure system 120 is located above the material tank 110, and can irradiate a light beam image to enable a layer of the photosensitive resin at the liquid surface of the material tank 110 to be cured. Each time after the image exposure system 120 irradiates the light beam image to enable the layer of the photosensitive resin to be cured, the lifting platform 130 will drive the layer of molded photosensitive resin to move downward slightly, and enable the photosensitive resin to be uniformly spread on a lop surface of the cured workpiece via a blade 131 and to get ready for the next irradiation. The cycle repeats, and a three-dimensional workpiece molded by layer addition will be obtained.

The image exposure system 120 commonly uses a laser molding technique or a digital light procession (DLP) projection technique.

Laser molding technique means pointwise scanning using a laser scanning device. However, due to the property of the photosensitive resin, the laser power cannot be too great, or the resin would be damaged. Therefore, the moving speed of the laser is limited to a few meters to no more than twenty meters per second, causing an excessively slow molding speed.

DLP projection imaging technique is realized by using a digital micromirror device (DMD) to control the reflection of light. The digital micromirror device can be considered as a mirror surface. This mirror is composed of hundreds of thousands or even millions of micromirrors. Each micromirror represents a pixel, and an image is constituted by these pixels. Each micromirror can be independently controlled to decide whether light rays are reflected to a projection lens. Finally, the whole mirror reflects the required light beam image. The application of DMD in 3D printing has many advantages, for example, it can handle ultraviolet light below 400 nm without the concern of damage; however, its limited resolution restricts its development, for example, the maximum resolution commonly used in current DMDs is 1920×1080. However, in 3D printing, this resolution at a usual accuracy of 0.1 mm can only produce an object with an area of 192 mm×108 mm, which significantly limits the application thereof.

SUMMARY

The technical problem to be solved by the present invention is to provide a photo-curing 3D printing device and an image exposure system thereof.

The technical solutions employed by the present invention to solve the above-mentioned technical problem is to propose an image exposure system of a 3D printing apparatus, comprising: a spatial light modulator having a plurality of micromirrors, each micromirror corresponding to one pixel and being used for adjusting a reflective direction of the light irradiating the micromirror according to a control signal, the reflective direction comprising a first direction and a second direction, wherein each micromirror is a concave mirror for converging the light irradiating the micromirror into a micro light spot having a dimension smaller than the dimension of the pixel corresponding to the micromirror; a light source for generating a tight beam irradiating the spatial light modulator; a projection lens aligned with the first direction of the spatial light modulator, for allowing a micro light spot array formed through the micromirrors by the light source to be projected onto a photosensitive material surface; a micro-displacement driving mechanism connected to the spatial light modulator and capable of driving the spatial light modulator to move in a third direction and a fourth direction which are perpendicular to each other, so as to finely adjust the position of the micro light spot array projected onto the photosensitive material surface; and a controller for commanding the light source to perform multiple exposures and for commanding the micro-displacement driving mechanism to move during each exposure, so that the micro light spot array is projected to a different position on the photosensitive material surface during each exposure.

In an embodiment of the present invention, images of the micro light spot array formed on the photosensitive material surface during the exposures substantially do not overlap one another.

In an embodiment of the present invention, the images formed from the micro light spot array during the exposures fully fill the photosensitive material surface.

In an embodiment of the present invention, the dimension of the micro light spot is less than, equal to or slightly greater than half of the dimension of the pixel corresponding to the micromirror.

In an embodiment of the present invention, assuming that focal lengths of the micromirrors are f, the dimension of the pixel corresponding to the micromirror is p, an included half-angle of the light beams incident on the respective micromirror is β, an image height of the micro light spot is a, and the maximum half-angle of an emergent light is W, the following equations are satisfied:

$$\tan(\beta)=(a/2)/f;$$

$$\tan(w)=((a+p)/2)/f;$$

$$Fno=1/(2\tan(w)).$$

In an embodiment of the present invention, the micro light spot array contain different image information during each exposure.

In an embodiment of the present invention, the ratio of the dimension of the micro light spot to the dimension of the pixel of the micromirror is approximately 1:2, 1:3 or 1:4.

In an embodiment of the present mention, the number of exposures of the light source is four, nine or sixteen.

In an embodiment of the present invention, the spatial light modulator is a digital micromirror device.

In an embodiment of the present invention, the micro-displacement driving mechanism is of a piezoelectric ceramic.

The present invention further proposes an image exposure system of a 3D priming apparatus, comprising: a spatial light modulator having a plurality of micromirrors, each micromirror corresponding to one pixel and being used for controlling a reflective direction of light irradiating the micromirror according to a control signal, the reflective direction comprising a first direction and a second direction, wherein each micromirror is a concave mirror for converging the light irradiating the micromirror into a micro light spot having a dimension smaller than the dimension of the pixel corresponding to the micromirror; a light source for generating a beam of light rays irradiating the spatial tight modulator, a projection lens aligned with the first direction of the spatial light modulator, for allowing a micro light spot array formed through the micromirrors by the light source to be projected onto a photosensitive material surface; a deflectable lens disposed between the spatial light modulator and the photosensitive material surface, the deflectable lens being capable of deflecting around at least one rotation axis which is perpendicular to an optical axis of the projection lens, so as to finely adjust the position of the micro light spot array projected onto the photosensitive material surface; and a controller for commanding the light source to perform multiple exposures and for commanding the micro-displacement driving mechanism to move during each exposure, so that the micro light spot array is projected to a different position on the photosensitive material surface during each exposure.

The present invention further proposes a photo-curing 3D printing apparatus, comprising the image exposure system mentioned above.

The present invention adopts the above technical solutions where the digital micromirror device is provided as a concave mirror, the photosensitive material surface can be fully filled with exposed light spots by means of multiple exposures in combination with the micro-displacement of the digital micromirror device, and different imaging information for each exposures is used, so that the resolution of imaging can be increased by several folds and the precision of printing is improved compared with the prior art.

DESCRIPTION OF THE DRAWINGS

In order to allow the above-mentioned objects, features and advantages of the present invention to be more easily understood, particular embodiments of the present invention are described in detail below in conjunction with the drawings, in which.

DETAILED DESCRIPTION

The embodiments of the present invention describe a photo-curing 3D printing apparatus and an image exposure system thereof, the image exposure system using a digital micromirror device as an area array image source.

Figure 1:
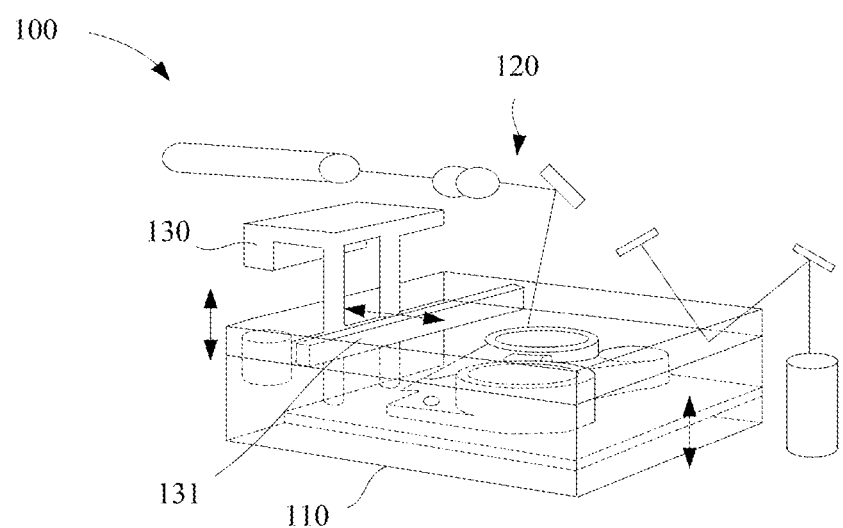
FIG. 1 shows a basic structure of a photo-curing 3D printing apparatus.
Figure 2:
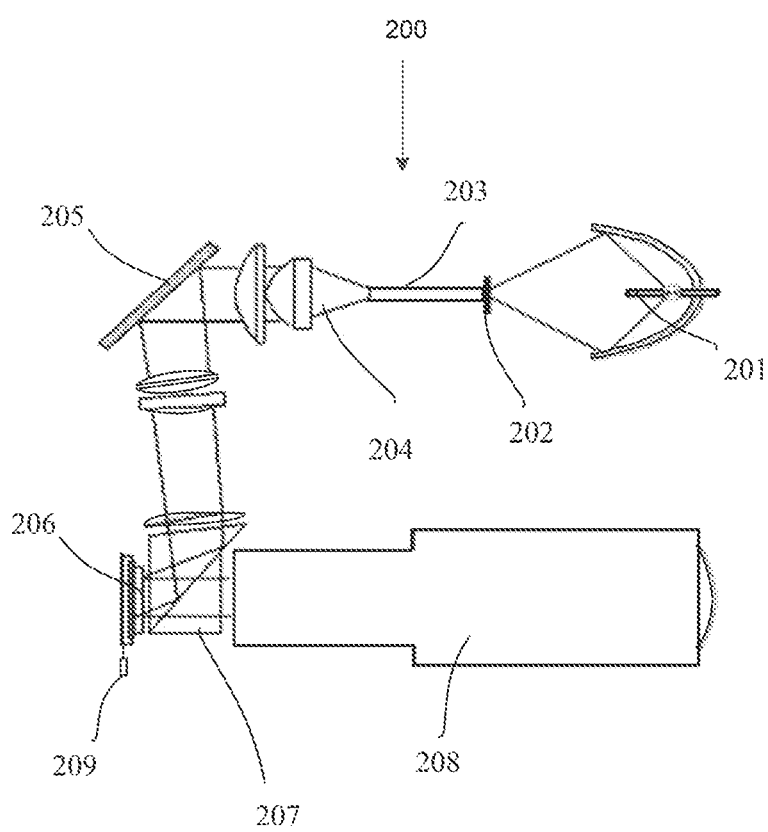
FIG. 2 shows an image exposure system of a 3D printing apparatus of an embodiment of the present invention.

FIG. 2 shows an image exposure system of a 3D printing apparatus of an embodiment of the present invention. Referring to FIG. 2, the image exposure system 200 of the present embodiment includes a light source 201, a bandpass filter 202, an integrator rod 203, a relay optical element 204, a reflecting mirror 205, a digital micromirror device 206, a TIR (Total Internal Reflection) prism 207, a projection lens 208, and a controller (not shown in the figure). For the sake of simplicity, devices unrelated to the present invention are omitted.

The light source 201 is used for generating a light beam required to be irradiating the digital micromirror device 206 the wavelength of the light emitted by the light source 201 is dependent on the photosensitive material to be molded by curing. For example, when a UV resin is selected as the photosensitive material, the light beam can be violet light to ultraviolet light, and the wavelength is below 430 nm, such as 360-405 nm.

In this embodiment, a plurality of optical devices is provided between the light source 201 and the digital micromirror device 206. As shown in FIG. 2, in the light source 201, light rays emitted by a UHP bulb are converged into a light point via a reflecting bowl. The light rays not required for curing the photosensitive material are filtered out from this light point by the bandpass filter 202, the light beam is then homogenized by the integrator rod 203, and then irradiate the TIR prism 207 by the cooperation of the reflecting mirror 205 and a lens group (if necessary); the light rays are reflected by the TIR prism 207 to the digital micromirror device 206, and finally the light rays reflected by the digital micromirror device 206 pass through the TIR prism 207 and the projection lens 208 and irradiate the photosensitive material surface.

Figure 3A:
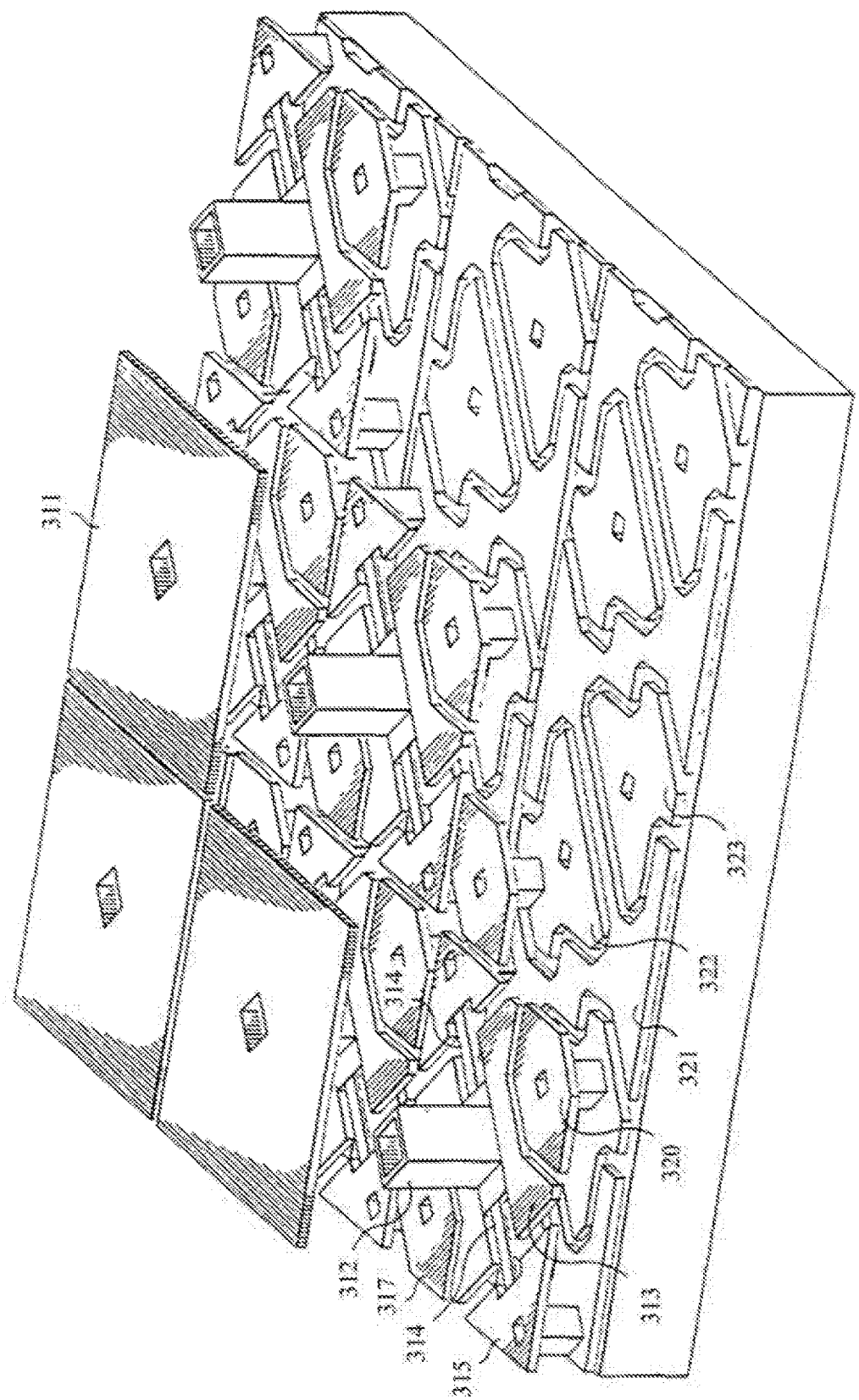
FIGS. 3A-3C show a structure diagram of a digital micromirror device of the image exposure system shown in FIG. 2.
Figure 3B:
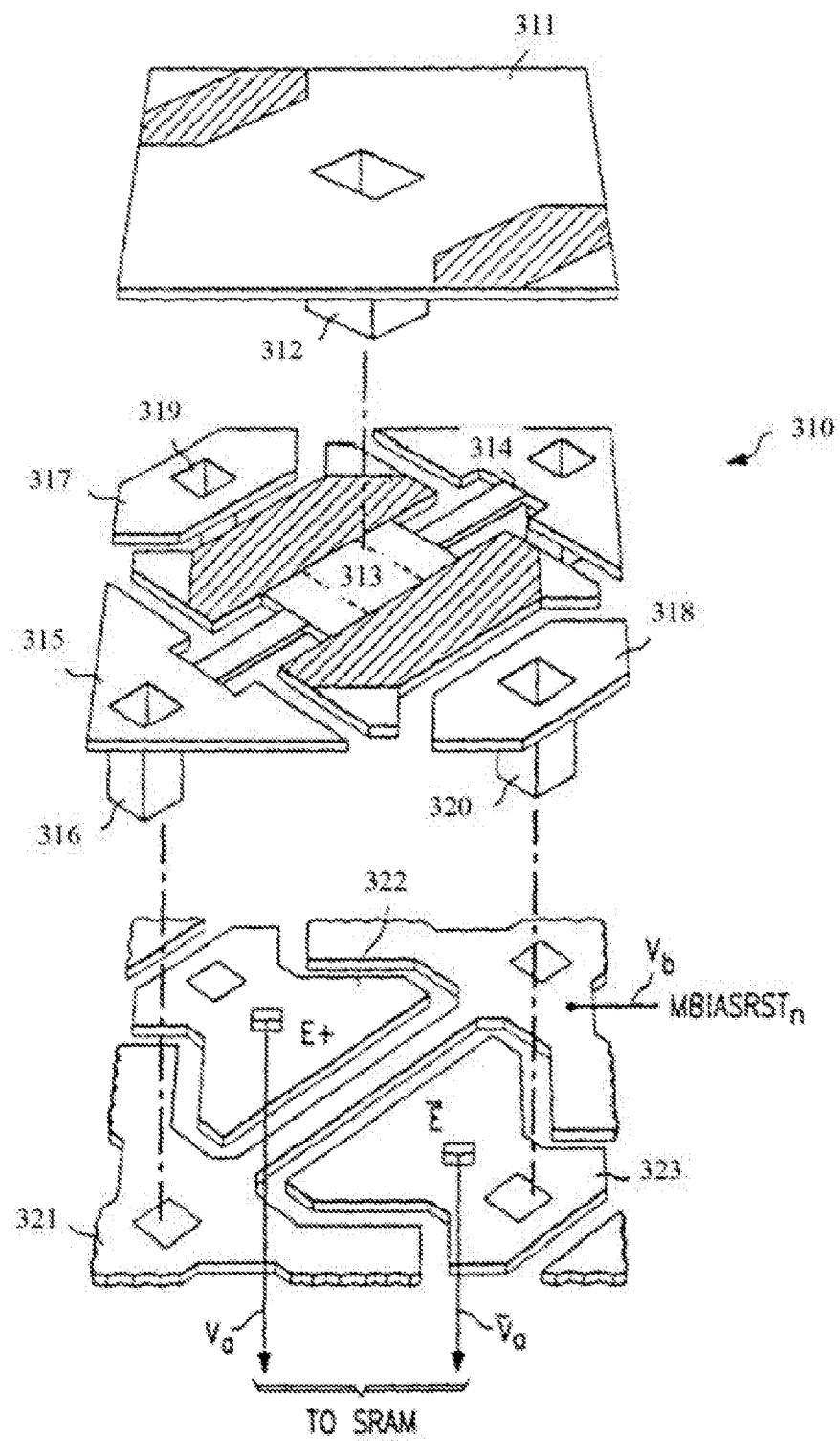
Figure 3C:
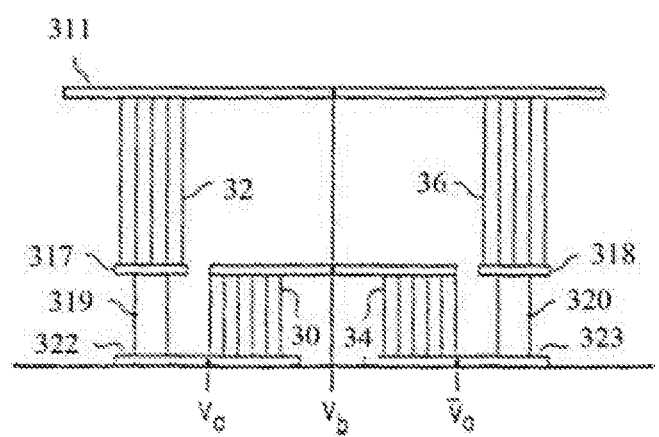

The digital micromirror device 206 is used as a spatial light modulator in the present invention. FIG. 3A shows a structure diagram of the digital micromirror device of the image exposure system shown in FIG. 2, FIG. 3B shows a structure diagram of a single pixel of FIG. 3A, and FIG. 3C shows a side view of FIG. 3B. Reference to FIGS. 3A-3C, the digital micromirror device can be simply described as a semiconductor optical switch, and tens to millions of pixels are gathered on a CMOS silicon substrate. One pixel 310 includes one micromirror 311, and the dimension of each micromirror 301 is, for example, about ten microns. In order to facilitate adjustment of the direction and angle, the micromirror 311 is installed on a yoke 313 via a support post 312 and is lifted by the support post, and the support post 312 extends downward from the center of the micromirror along the torsion axis thereof until the center of the yoke 313, so that the center of mass of the micromirror 311 remains balanced on the yoke 313. The yoke 313 is axially supported by a pair of torsion hinges 314 along a central axis thereof, the other end of the torsion hinge 314 extends to and is installed on a support post cap 315, and the support post cap 315 is formed on the top end of a respective support post 316. A pair of elevated micromirror addressing electrodes 317 and 318 is supported by respective addressing support posts 319 and 320. The addressing support posts 319 and 320 and the support posts 316 support the addressing electrodes 317 and 318 and the torsion hinges 314; and the yoke 313 is spaced apart from and located above a bias/reset bus 321 and a pair of substrate level addressing electrode sheets 322 and 323.

The rotation of the micromirror of the digital micromirror device is controlled by a digital driving signal from a SRAM. When the digital signal is written into the SRAM, the SRAM outputs an addressing voltage to the digital micromirror device. The addressing voltage is applied in one of the two addressing electrode sheets 322 and 323, and is applied to one of the corresponding elevated micromirror addressing electrodes 317 and 318 via the associated electrode support posts 319 and 320. At the same time, a bias voltage is applied to the bias/reset bus 321, and is applied to the yoke 313 via the support posts 316, the support post caps 315 and the torsion hinges 314, as well as to the micromirror 301 via the support member 312.

By addressing one electrode sheet 322 or 323, which in turn generates an addressing voltage on the corresponding elevated addressing electrode 317 or 318, electrostatic attraction forces are generated at two places, as shown at 30 and 32, or at 34 and 36. Selectively applying the addressing voltage to one of the two addressing electrodes 317 and 318 can determine in which direction the micromirror 301 and the yoke 313 rotate once the voltage is applied to the bias bus 321 as well as the yoke 313 and the micromirror 301.

Figure 4:
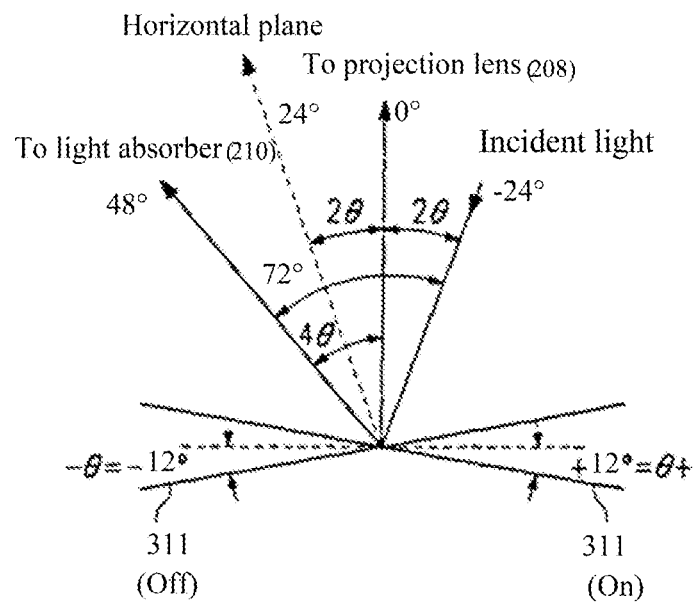
FIG. 4 shows the operation principle of the digital micromirror device of the image exposure system.

FIG. 4 shows the operation principle of the digital micromirror device of the image exposure system. In short, the operation principle of the digital micromirror device is to reflect the wanted light to the projection lens by the micromirrors and meanwhile absorb the unwarned light by a light absorber so as to achieve a projection of the image, and the irradiation direction is achieved by controlling the angle of the micromirror by means of electrostatic interaction.

By addressing a memory cell under each micromirror with a binary plane signal, each micromirror of the digital micromirror device is electrostatically tilted to an on or off state. The technique for determining in which direction and how long each micromirror is tilted is called pulse width modulation (PWM). The micromirror can be switched more than 1000 times per second. The proportion of the number of on and off states of the micromirror can be controlled to achieve the purpose of controlling the brightness (gray scale) of this point in the image.

Light rays from a projection lamp pass through a condenser lens and the filter and then irradiate the micromirror. As shown in FIG. 4, the direction in which the digital micromirror device is aligned with the projection lens 208 is taken as 0° position. The incident light rays directly irradiate the digital micromirror device at 24°. When a certain micromirror of the digital micromirror device is at an "on" position, i.e. +12°, the incident light is reflected thereby and then enters the projection lens 208 arranged at the 0° position, and a projection image is formed on the photosensitive material surface; and when the lens is at an "off" position, i.e. −12°, the incident light is reflected thereby and then enters the light absorber 210 at the 48° position, and would not irradiate the photosensitive material surface.

In addition, the micromirror also has a "flat" position, in which the incident light is reflected thereby and then is emitted at an angle of 24°.

Figure 6:
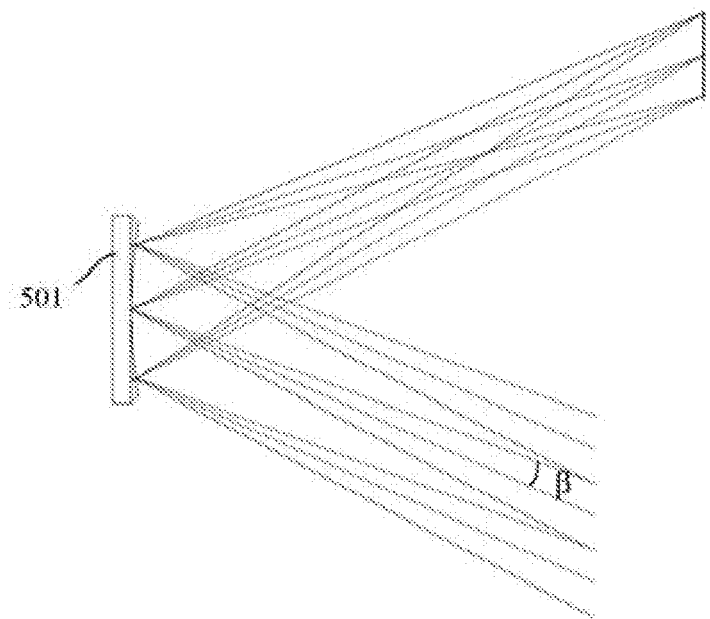
FIG. 6 stows a diagram of a converged light path of a single micromirror, at a deflection angle of 0°, of the digital micromirror device shown in FIG. 3.
Figure 7:
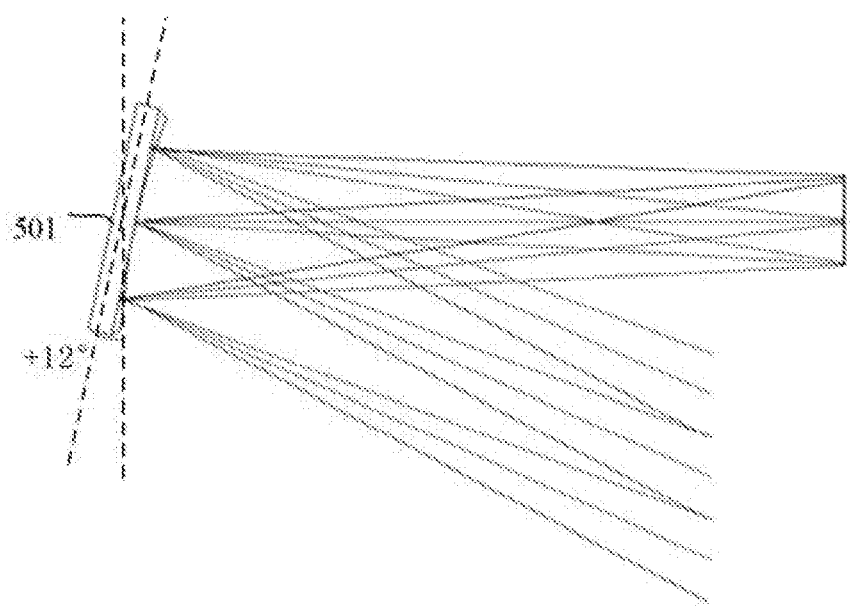
FIG. 7 shows a diagram of a converged light path of a single micromirror, at a deflection angle of +12°, of the digital micromirror device shown in FIG. 3.

In the embodiment of the present invention, each micromirror of the digital micromirror device is designed to be a concave mirror, which can converge the light irradiating the micromirror into a micro light spot having a dimension smaller than the dimension of the micromirror in cooperation with the following rigorously designed irradiating system. FIG. 6 shows a diagram of a converged light path of a single micromirror of the digital micromirror device shown in FIG. 3. FIG. 7 shows a diagram of a converged light path of a single micromirror, at a deflection angle of +12°, of the digital micromirror device shown in FIG. 3. Reference to FIGS. 6 and 7, parallel light beams at a certain angle are incident on one micromirror 501 having the characteristics of a concave mirror. Assuming that the focal length f of the concave surface of the micromirror 501 is 60 μm, the dimension p of the pixel corresponding to the micromirror is 14 μm, and the included half-angle β of the light beam is 3.5°, the image height a of the micro light spot formed by means of reflection of the micromirror is:

$\tan(\beta) = (a/2)/f;$ $a = 2*f*\tan \beta = 7.3 \text{ μm};$ that is, an image having a dimension of 7.3 μm is present in front of the micromirror, the dimension being about ½ of the pixel dimension.

W is the maximum half-angle of the emergent light, and then:

tan(w)=((a+p)/2)/f=((7.3+14)/2)/60=0.1775,
W=10.065°;

the f-number Fno is calculated as fellows:

Fno=1/(2 tan(w))=2.8.

That is to say, in the light path system, light, rays incident at 24° is reflected by the micromirror, which is deflected at +12°, into an emergent light at 0°, the light rays enter the projection lens at 0°, and the lens can enable all the light rays to pass simply by using an aperture value of 2.8. Moreover, the focal plane of the lens is no longer on the micromirror of the digital micromirror device, but is located in the micro light spot array in front of the digital micromirror device, such that an array consisting of micro light spots much smaller than the original area of the micromirror is projected onto the photosensitive material surface and is finally imaged on the photosensitive material surface, forming exposed spots.

Another advantage of convergence is that, after convergence, although the area of the micro light spots is reduced, the brightness of the micro light spot is increased in the same proportion, so that when the micro light spot is finally imaged on the photosensitive material surface, the curing area is reduced, the curing time is shortened in the same proportion, and after multiple exposures, the micro light spot will fully fill the entire resin surface; thus the present invention can improve the resolution of projection, white keeping the total exposure time required for curing and direct exposure substantially unchanged.

Figure 8:
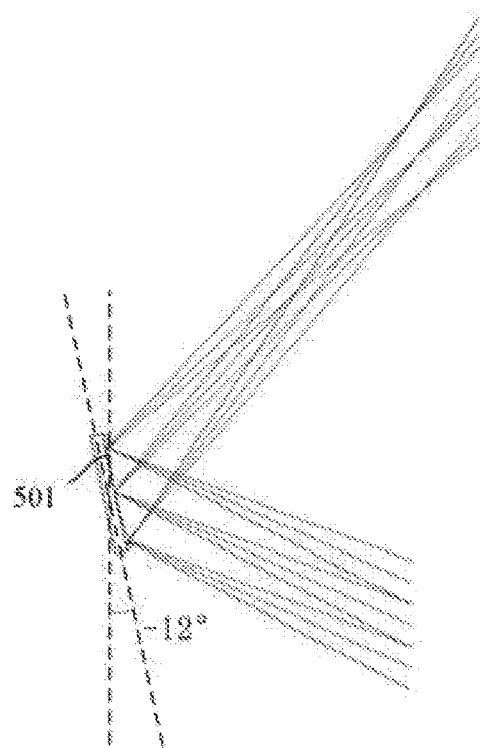
FIG. 8 stows a diagram of a converged light path of a single micromirror, at a deflection angle of −12°, of the digital micromirror device shown in FIG. 3.

FIG. 8 shows a diagram of a converged light path of a single micromirror, at a deflection angle of −12°, of the digital micromirror device shown in FIG. 3. It can be seen that the light rays now are deflected to 48°, and are absorbed by the light absorber 210 which is located in this position. In this case, the beam angle is limited to 48°±10.065°, i.e. the minimum beam angle is 48−10.065°≈38°, which is much larger than the acceptable range±10.065° of the projection lens, and would not enter the light path.

In fact, due to possible manufacturing defects of the micromirror 501, particularly due to the existence of a diffraction effect of light, the light spot dimension may be slightly greater than the dimension actually calculated, and the light spot may also become round in shape, and this requires the aforementioned parameters to be adjusted in an actual experiment so as to determine the final data.

Figure 5:
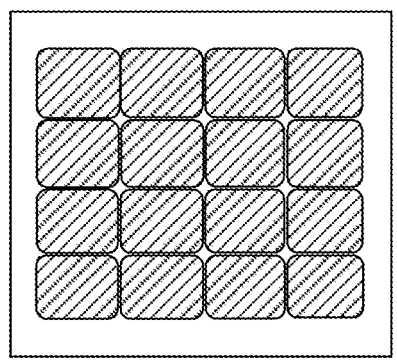
FIG. 5 shows a directly projected image of the DMD.
Figure 9:
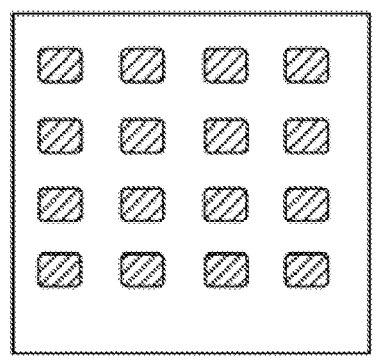
FIG. 9 shows an image formed on a photosensitive material surface by the image exposure system of the embodiment of the present invention after one exposure.

FIG. 9 shows an image formed on a photosensitive material surface by the image exposure system of the embodiment of the present invention after one exposure. As a comparison, if the light rays directly pass through micromirror for imaging, the resulting image will occupy almost the entire projection area since the gaps between the micromirrors are very small (see FIG. 5). It can be seen by comparing FIG. 5 with FIG. 9 that after being converged by the micromirror which is in the form of a concave mirror, the dimension of the light spot in the image is decreased. The size of the imaging light spot can be controlled by means of precise design of the shape of the irradiating system and the concave mirror. For example, the ratio of the dimension of the imaging light spot to the pixel dimension (the dimension of the micromirror) may be 1:2, i.e. the ratio of areas is 1:4.

In addition, the ratio of the dimension of the imaging light spot to the pixel dimension may be approximately 1:3 or 1:4. The reason why an integer multiple is taken here is that in consideration of subsequent micro-displacements, a new micro light spot needs to be inserted into a blank portion of each micro light spot.

As shown in FIG. 9, a blank is left between light spots in an image exposed once on the photosensitive material surface. For this purpose, these blanks are filled by multiple exposures, so that the light spots fully fill the entire surface of the photosensitive material.

As shown in FIG. 2, the digital micromirror device 206 is connected to a micro-displacement driving mechanism 209. The micro-displacement driving mechanism 209 can drive the digital micromirror device 206 to move in x direction and y direction, so as to finely adjust the position of the micro light spot array projected onto the photosensitive material surface. Here, x and y directions are within the same plane, and this plane is perpendicular to the optical axis z of the image exposure system. When the micro-displacement driving mechanism docs not drive the displacement of the digital micromirror device 206, the micro light spot array of the digital micromirror device 206 is imaged on the photosensitive material surface in a first position; and when the micro-displacement driving mechanism 209 drives the micro-displacement of the digital micromirror device 206 in a direction (x or y direction), the entire micro light spot array of the digital micromirror device 206 is slightly displaced along with the digital micromirror device 206, so as to be imaged in a position of the photosensitive material surface other than the first position.

Figure 10:
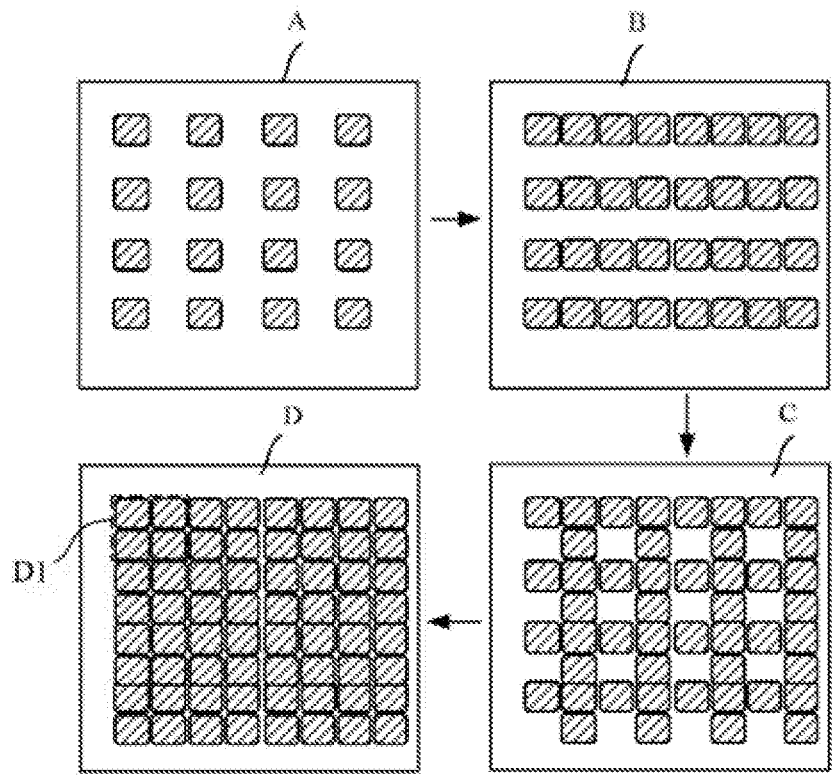
FIG. 10 shows images formed on the photosensitive material surface by the image exposure system of the embodiment of the present invention after four exposures.

In conjunction with multiple exposures, the above-mentioned displacement can cause light spot images during the exposures to be superimposed, so that the light spots fully fill the photosensitive material surface. Specifically, the light source 201 can perform multiple exposures, and during each exposure, the digital micromirror device 206 is commanded to displace, so that the micro light spot array is projected to a different position on the photosensitive material surface during each exposure. FIG. 10 shows images formed on the photosensitive material surface by the image exposure system of the embodiment of the present invention after four exposures. With reference to FIG. 10, during the first exposure, a projected image A is formed; during the second exposure, since the micro-displacement driving mechanism 209 moves in the x direction by a distance of ½ of the pixel size, the micro light spot array moves slightly in a horizontal direction in the figure and is projected onto a blank between two columns of micro light spots, and a projected image B is formed; during the third exposure, the micro-displacement driving mechanism 209 moves in the y direction, so that the micro light spot array moves slightly in a vertical direction to the figure by a distance of ½ of the pixel size and is projected onto a blank between two rows of micro light spots, and a projected image C is formed; and similarly, a projected image D is formed. With the projected image D, the photosensitive material surface is fully filled.

The micro-displacement driving mechanism 209 may be of a piezoelectric ceramic. In practice, a controller of the image exposure system 200 can be used to command the light source 201 to perform multiple exposures, and at the same time, to command the micro-displacement driving mechanism 209 to cooperatively perform movement in x and y directions during each exposure.

The projection lens 208 is disposed between the digital micromirror device 206 and the photosensitive material surface of the three-dimensional printing apparatus, and the micro light spot array reflected by the digital micromirror device 206 is projected onto the photosensitive material surface.

It needs to be noted that although the superimposed micro light spot arrays during the exposures fully fill the photosensitive material surface, the positions of the micro light spot arrays during the exposures on the photosensitive material surface may substantially not overlap one another. This is realized by controlling the ratio of the pixel dimension to the dimension of the light spot to be an integer and the step of displacement to be exactly identical to the light spot dimension. Such a substantially non-overlapping arrangement may avoid a decrease in resolution. It can be understood that in consideration of factors such as a diffraction effect of light, slight overlapping is helpful for making up for the missing of a non-rectangular edge portion of the micro light spot. Therefore, it is not required to completely prevent the micro light spots from overlapping. In addition, although the superimposed micro light spot arrays fully fill the photosensitive material surface, it can be understood that not all positions in the micro light spot arrays are bright spots, but there may be dark spots.

Figure 11:
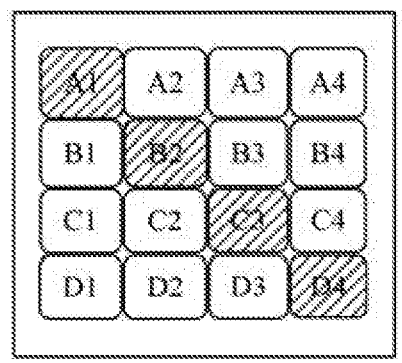
FIG. 11 shows a schematic diagram of image extraction by the image exposure system of the embodiment of the present invention.

In an embodiment of the present invention, the micro light spot array contain different image information during each exposure. Taking FIG. 10 as an example, in the projection pattern D, four micro light spots D1 within a dashed box contain image information different from each other. This means that the resolution at the projection pattern correspondingly becomes four times of the original resolution. Therefore, the precision of 3D printing is significantly improved. These different image information may be from four different image files which can constitute a complete image, and may also be four sub-images extracted from a processed image of the same image file. In the example shown in FIG. 11, the image contains 4*4=16 pixels A1-A4, B1-B4, C1-C4, and D1-D4, wherein the shaded pixels indicates that an exposure is required, and the non-shaded pixels indicates that no exposure is required. Here, pixel groups {A1, A3, C1, C3}, {A2, A4, C2, C4}, {B1, B3, D1, D3}, and {B2, B4, D2, D4} can be extracted separately from the image as four sub-images, which are respectively used for four exposures. In contrast, for the image used in conventional printing apparatuses, the size of each pixel is that of at least 4 pixels such as {A1, A2, B1, B2} shown in FIG. 11, and thus the resolution is significantly lower.

In the above-mentioned example, four exposures are performed when the dimension of the micro light spot is controlled to be ½ of the pixel dimension. It can be understood that nine exposures can be performed when the dimension of the micro light spot is controlled to be ⅓ of the pixel dimension, and sixteen exposures can be performed when the dimension of the micro light spot is controlled to be ¼ of the pixel dimension, and so on.

Figure 12:
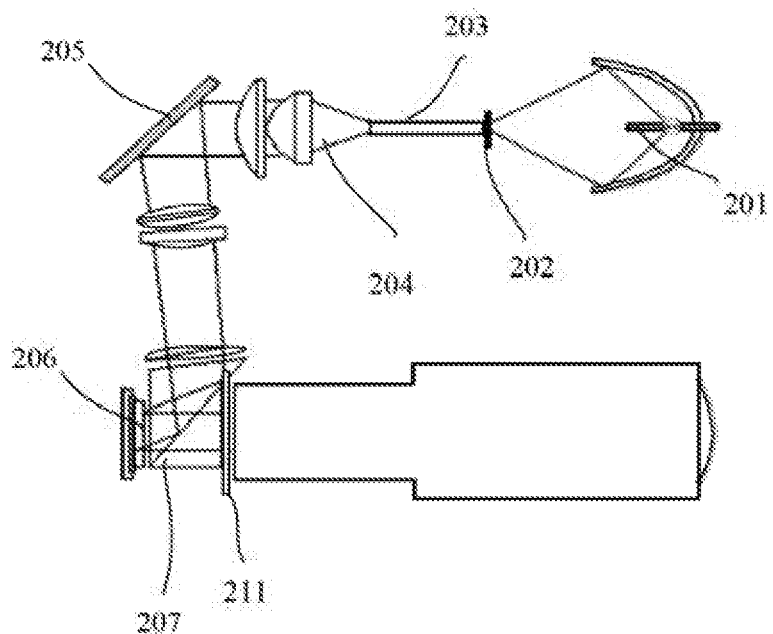
FIG. 12 shows an image exposure system of a 3D printing apparatus of another embodiment of the present invention.
Figure 13:
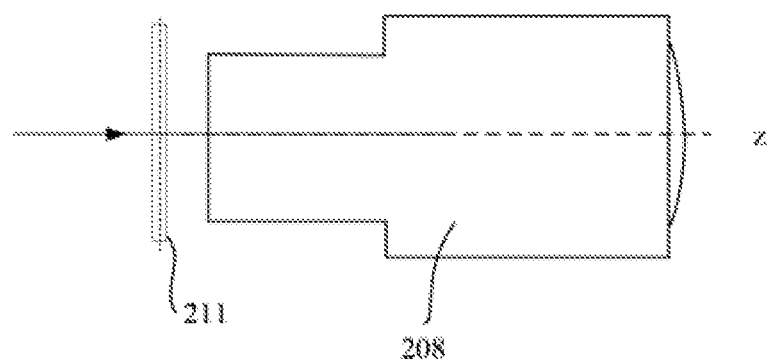
FIG. 13 shows a schematic diagram of a light path of a deflectable lens, which is not deflected, of the image exposure deflection system shown in FIG. 12.
Figure 14:
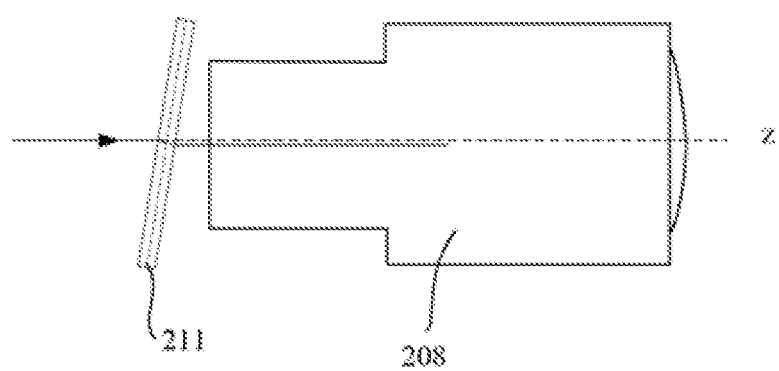
FIG. 14 shows a schematic diagram of the light path of the deflectable lens, which has been deflected, of the image exposure deflection system shown in FIG. 12.

FIG. 12 shows an image exposure system of a 3D printing apparatus of another embodiment of the present invention. In the present embodiment, the aforementioned micro-displacement driving mechanism 209 is replaced by a deflectable lens 211. The deflectable lens 211 may be arranged in any position in the light path from the digital micromirror device to the photosensitive resin, and is generally disposed in a position near the projection lens. The deflectable lens 211 can deflect around at least one rotation axis so as to finely adjust the position of the light, beam projected on the photosensitive material surface. The aforementioned rotation axes are all perpendicular to the optical axis z of the image exposure system, and when the deflectable lens 211 is parallel to the digital micromirror device 206 (perpendicular to the optical axis z), light rays perpendicularly irradiates the deflectable lens 211 (as shown in FIG. 13), and at this moment, no refraction phenomenon occurs and light rays directly pass through the deflectable lens 211; and if the deflectable lens 211 tilts an angle around a rotation axis, the light rays will be refracted when entering the deflectable lens 211 from the air, the light rays will be refracted again when entering the air from the deflectable lens 211, and the refraction angles of the two refractions are the same while the directions are opposite, therefore the refracted light rays will move forward in the original direction but with a mirror displacement (as shown in FIG. 14). In addition, this rotation axis can be a rotation axis y, which is located within a plane containing the rotation axis x and perpendicular to the optical axis z, and which is perpendicular to the rotation axis x. In the embodiments of the present invention, the deflectable lens 211 can not only deflect around the rotation axis x, but can also deflect around the rotation axis y.

In the same way, in conjunction wish multiple exposures, the above-mentioned deflection can cause light beam images during the exposures to be superimposed, so that the light spots fully fill the photosensitive material surface. Specifically, the light source 201 can perform multiple exposures, and during each exposure, the deflectable lens 211 is commanded to deflect, so that light beam images are projected onto different positions of the photosensitive material surface during the exposures.

In practice, a controller of the image exposure system 200 can be used to command the light source 201 to perform multiple exposures, and at the same time, to command the deflectable lens 211 to cooperatively perform deflection in x and y directions during each exposure.

In the above-mentioned embodiments of the present invention, the digital micromirror device is provided as a concave mirror, the photosensitive material surface can be fully filled with exposed light spots by means of multiple exposures in combination with the micro-displacement of the digital micromirror device, and different imaging information for each exposure is used, so that the resolution of imaging can be increased by several folds and the precision of printing is improved.

Although the present invention has been described with reference to the present particular embodiments, the ordinary skilled in the art is to recognize that these embodiments are only for illustrating the present invention, and that various equivalent changes or replacements can be made without departing from the spirit of the present invention; hence, changes and variations to the above-mentioned embodiments within the true spirit scope of the present invention will all fall into the scope of the claims of the present application.

The invention claimed is:

1. An image exposure system of a 3D printing apparatus, comprising:
    a light source that generates a light beam;
    a spatial light modulator including a plurality of micromirrors, each of the plurality of micromirrors being irradiated by a respective portion of the light beam, each of the plurality of micromirrors being selectively positionable in an on position and an off position according to a control signal, each of the plurality of micromirrors reflecting the respective portion of the light beam in a first direction when the micromirror is in the on position and in a second direction when the micromirror is in the off position, each of the plurality of micromirrors including a concave mirror for converging the reflected portion of the light beam;

a projection lens aligned with the first direction and directing each of the respective light beam portions reflected in the first direction by the spatial light modulator onto a photosensitive material surface to form a two-dimensional array of light spots on the photosensitive material surface, each of the light spots being separated from all of the other light spots by an intervening space sized to accommodate at least one of the light spots;

a micro-displacement driving mechanism connected to the spatial light modulator and operable to reposition the spatial light modulator relative to the projection lens in a third direction and a fourth direction that is perpendicular to the third direction, so as to reposition the two-dimensional array of light spots on the photosensitive material surface; and a controller that controls the light source to perform multiple exposures and the micro-displacement driving mechanism to reposition the spatial light modulator, relative to the projection lens, between exposures, so that the two-dimensional array of light spots is projected to a different position on the photosensitive material surface during each exposure.

2. The image exposure system of a 3D printing apparatus of claim 1, wherein the controller controls the spatial light modulator and the micro-displacement driving mechanism during the multiple exposures so that the two-dimensional array of light spots fully fill the photosensitive material surface.

3. The image exposure system of a 3D printing apparatus of claim 1, wherein each light spot has a dimension less than or equal to half of a dimension of the micromirror.

4. The image exposure system of a 3D printing apparatus of claim 1, wherein:
   each of the micromirrors has a focal length equal to f and a dimension equal to p;
   an included half angle of the respective portion of the light beam incident on the respective micromirror is β;
   a height of each of light spot on the photosensitive material surface is a;
   the maximum half angle of an emergent light is W;
   $\tan(\beta)=(a/2)/f$;
   $\tan(w)=((a+p)/2)/f$; and
   $Fno=1/(2\tan(w))$.

5. The image exposure system of a 3D printing apparatus of claim 1, wherein the two-dimensional array of light spots contains different image information during each exposure.

6. The image exposure system of a 3D printing apparatus of claim 1, wherein a ratio of a dimension of each of the light spots formed on the photosensitive material surface to a dimension of each of the micromirrors is approximately 1:2, 1:3 or 1:4.

7. The image exposure system of a 3D printing apparatus of claim 1, wherein the multiple exposures consist of four, nine or sixteen exposures.

8. The image exposure system of a 3D printing apparatus of claim 1, wherein the spatial light modulator comprises a digital micromirror device.

9. The image exposure system of a 3D printing apparatus of claim 1, wherein the micro-displacement driving mechanism comprises a piezoelectric ceramic.

10. A photo-curing 3D printing apparatus, comprising the image exposure system of claim 1.

11. An image exposure system of a 3D printing apparatus, comprising:
    a light source that generates a light beam;
    a spatial light modulator including a plurality of micromirrors, each of the plurality of micromirrors being irradiated by a respective portion of the light beam, each of the plurality of micromirrors being selectively positionable in an on position and an off position according to a control signal, each of the plurality of micromirrors reflecting the respective portion of the light beam in a first direction when the micromirror is in the on position and in a second direction when the micromirror is in the off position, each of the plurality of micromirrors including a concave mirror for converging the reflected portion of the light beam;
    a projection lens aligned with the first direction and directing each of the respective light beam portions reflected in the first direction by the spatial light modulator onto a photosensitive material surface to form a two-dimensional array of light spots on the photosensitive material surface, each of the light spots being separated from all of the other light spots by an intervening space sized to accommodate at least one of the light spots;
    a deflectable lens disposed between the spatial light modulator and the photosensitive material surface, the deflectable lens being controllable to reposition the two-dimensional array of spots on the photosensitive material surface in a third direction and a fourth direction perpendicular to the third direction; and
    a controller that controls the light source to perform multiple exposures and the deflectable lens so that the two-dimensional array of light spots is projected to a different position on the photosensitive material surface during each exposure.

* * * * *